United States Patent [19]

Wrigley et al.

[11] 3,999,209
[45] Dec. 21, 1976

[54] PROCESS FOR RADIATION HARDENING OF MOS DEVICES AND DEVICE PRODUCED THEREBY

[75] Inventors: Charles Y. Wrigley, Fullerton; Raymond A. Kjar, Newport Beach, both of Calif.

[73] Assignee: Rockwell International Corporation, El Segundo, Calif.

[22] Filed: Sept. 14, 1970

[21] Appl. No.: 71,701

[52] U.S. Cl. .................. 357/23; 29/571; 357/29; 357/52; 357/54
[51] Int. Cl.² .................. H01L 29/78
[58] Field of Search ............ 317/235 B; 357/23, 29, 357/41, 52, 54; 29/571

[56] References Cited
UNITED STATES PATENTS

3,547,717  12/1970  Lindmayer .................. 148/187

OTHER PUBLICATIONS

Lindmayer et al., IEEE Trans. Electron Devices, vol. ED15, No. 9 pp. 637–640 (Sept. 1968), "Radiation Resistant MOS Devices".
Snow et al., "Effects of Ionizing Radiation . . .", Proc. IEEE, vol. 55, No. 7, July 1967, pp. 1168 and 1172 relied upon.

Primary Examiner—William D. Larkins
Attorney, Agent, or Firm—L. Lee Humphries; H. Frederick Hamann

[57] ABSTRACT

An MOS device and a method for making such device where an insulating layer over the gate region is formed at critical temperatures results in hardening the device against high energy particle and electromagnetic radiation effects. A layer of chromium on top of the gate insulating layer is used to enhance the hardening, and diffusion of a portion of the chromium layer into the insulating layer maintains a high degree of control over ionization damage.

11 Claims, 23 Drawing Figures

INVENTORS
CHARLES Y. WRIGLEY
RAYMOND A. KJAR
BY
Martin E Gerry
AGENT

INVENTORS
CHARLES Y. WRIGLEY
RAYMOND A. KJAR

BY Martin E Gerry

AGENT

PROCESS FOR RADIATION HARDENING OF MOS DEVICES AND DEVICE PRODUCED THEREBY

BACKGROUND OF THE INVENTION

1. Field of Invention

This invention relates to MOS devices and describes effects of chromium doping on ionization damage in MOS devices and a process to achieve hardening against radiation for such devices.

2. Prior Art

A number of studies have been made concerning ionizing radiation damage in metal-oxide-semiconductor field-effect transistors (MOS FET's). Such studies are: (1) E. H. Snow, A. S. Grove, and D. J. Fitzgerald, "Effects of ionizing radiation on oxidized silicon surfaces," *Proc IEEE*, vol. 55, pp 1168–1185, July 1967; (2) H. L. Hughes and R. R. Giroux, "Space radiation effects MOS FET's," *Electronics*, vol. 37, No. 32, pp 58–60, 1964; (3) J. P. Mitchell and D. K. Wilson, "Surface effects of radiation on semiconductor devices," *BSTJ*, vol. 46, pp 1–80, January 1967; (4) K. H. Zaininger and A. G. Holmes-Siedle, "A survey of radiation effects in metal insulator semiconductor devices," *RCA Review*, pp 208–240, June 1967; and (5) E. Kooi, "Effects of ionizing irradiation on the properties of oxide-covered silicon surfaces," *Philips Research Reports*, vol 20, pp 595–619, 1965. These studies have shown that the ionization and trapping of charge carriers in the gate oxide are responsible for much of the radiation damage. Additional damage occurs because of an associated increase in fast surface state density. The electrical manifestations of ionization damage in MOS FET's are a change in threshold voltage (the gate voltage required for conduction) and a decrease in transconductance due to the additional surface states. Serious device damage and circuit failure can occur at relatively small ionizing radiation doses. At present, the use of MOS FET's in ionizing environments is limited by this sensitivity to ionization effects.

A number of approaches have been suggested which might improve the radiation hardness of MOS FET's. These involve either the use of a new gate dielectric material or some method of modifying the presently used silicon dioxide so as to reduce net charge trapping. These approaches have been stated in: (1) K. H. Zaininger, A. G. Homes-Siedle, and W. J. Dennehy, "Radiation effects in complementary MOS transistors," Tech. Reports under AFAL Contract F33615-67-C-1140, 1968; and (2) A. G. Stanley, "Comparison of MOS and metal-nitride-semiconductor insulated gate field effect transistors under electron irradiation," *IEEE Trans. Nuclear Science*, vol. NS-13, pp 248–254, December 1966. The most promising methods of modifying the silicon dioxide consist of doping the gate oxide with a multivalent metal. Titanium, chromium, and aluminum have been used for this purpose. Such methods have been described in: (1) J. Lindmayer and W. P. Noble, Jr., "Radiation resistant MOS devices," *IEEE Trans. Electron Devices*, vol. ED-15, pp 637–640, September 1968; (2) R. Baer and D. Long, "A new radiation hard MOS transistor," IEEE An. Conf. on Nuclear and Space Radiation Effects, Columbus, Ohio, 1967.

SUMMARY OF INVENTION

MOS FET's and capacitors were fabricated using chromium metallization. Chromium was diffused into the oxide from the electorde. Starting materials were <111> and <100> n-type silicon with resistivities of ~10Ω-cm and 5Ω-cm, respectively. Conventional MOS oxidation, photomasking, etching and diffusion steps were used in the fabrication process, up to the point of gate oxidation. The gate oxide was grown in dry oxygen at 1000–1040° centigrade to a thickness of approximately 1200A, and the oxidation was followed by an anneal in dry nitrogen. After oxidation, chromium was vacuum deposited using direct electron beam heating. The wafers were photomasked, etched, and baked in a dry nitrogen atmosphere. This step diffuses chromium into the oxide. Similar devices with aluminum gate electrodes and the same gate oxidation step were also made and used as controls.

The completed devices showed excellent stability with typical threshold shifts of less than 50 mV under bias-temperature stress, and no changes in device characteristics were observed after a 12-hour bake at 280° C or following several months of shelf storage. This degree of stability would be expected without the presence of chromium and there appeared to be no change in device stability due to chromium doping of the oxide.

Chromium-doped devices were irradiated under operating conditions in a $Co^{60}$ gamma cell. The effects of radiation on MOS FET's were measured by monitoring threshold voltage and capacitance-voltage curves before and during irradiation. The high frequency capacitance-voltage and conductance-voltage curves of MOS capacitors were similarly monitored during irradiation. The capacitance and conductance measurements were made using a Princeton Applied Research Laboratories Model HR-8 lock-on amplifier as a phase sensitive detector. Surface state density was estimated from the distortion of the C-V curves and the difference between threshold and flat-band voltage. Net oxide charge was determined from the shift of the intrinsic point on the C-V curve.

The greatest difference between threshold shifts in chromium-gate MOS FET's and conventional, aluminum-gate MOS FET's is found during irradiation at zero, or negative bias, as shown in data tabulated in FIG. 18. FIG. 19 shows the effect due to ionization doses at a specific radiation bias for three different types of MOS devices, Type 3 in accordance with this invention. Chromium reduces the initial rate of threshold shift by an order of magnitude and reduces the maximum shift by a factor of two to three. The bias dependence of the threshold shift is as shown in FIG. 20. Much greater shifts are observed during irradiation with positive gate bias than with zero or negative gate bias, and no improvement due to chromium doping could be found in the positive bias range.

Chromium is also found to reduce the number of surface states generated by ionizing radiation, and the number of states formed during irradiation is strongly dependent upon gate bias during irradiation. This result is shown in FIG. 21 for chromium-dope MOS capacitors fabricated on <100> silicon. During irradiation with negative gate bias, the surface state density increases from an initial value of $\sim 10^{10}/cm^2$ to a maximum of about $3 \times 10^{11}/cm^2$. A similar but greater increase to $8 \times 10^{11}/cm^2$ occurs during irradiation with zero or positive gate bias. Saturation with dose occurs at about $5 \times 10^6$ rads for both bias conditions. MOS capacitors fabricated on <111> silicon have higher initial surface state densities (typically 2 to 3 ×

$10^{11}/cm^2$) but show smaller increases during irradiation, and the total surface state density, after irradiation to saturation, is not strongly dependent upon orientation. In contrast to these results, control devices with undoped dry oxides showed surface state increases of $3 \times 10^{12}/cm^2$ after $10^6$ rads, and no bias dependence was observed.

Thermal annealing experiments were performed on chromium-doped MOS FET's (dry oxidation, <111> silicon) which had received an ionizing does of $10^6$ rads. Threshold voltage and net oxide charge, as computed from C-V curves, were monitored during annealing. An activation energy spectrum was estimated from isothermal annealing data using a technique similar to that used previously for aluminum gate devices. This technique consists of matching isothermal curves to the expression, $$N(t) = \int_0^\infty n_o(E) \exp[-At \exp(-E/kT)]dE.$$

The change in $N(t)$ is related by a constant to the thermal annealing of radiation damage, $t$ is the annealing time at a fixed temperature, $T$, and $k$ is Boltzman's constant. $E$ is the activation energy associated with the annealing process. $A$ is a frequency factor and was taken to be $10^7 \, sec^{-1}$ after the value used by Danchenko and Desai. The term, $n_o(E)$, represents the initial distribution of annealing processes with activation energies between $E$ and $E + dE$. It is assumed that each curve is dominated by processes with activation energy near $$E_o = kT \ln(At).$$

The distribution function can then be found by fitting the slope of each isothermal curve to $$n_o(E_o) \cong -(t/kT)(dN(t)/dt).$$

Isothermal annealing curves were taken at 50 deg steps from 100° to 400° C with a 5½ hour annealing period at each temperature. The activation energy spectrum shown in FIG. 22 was derived from the threshold voltage data. A broad spectrum with a sharp peak at about 1.3 eV was found for chromium-doped devices. This result contrasts with the broad spectrum peaking at 0.9 eV reported for aluminum gate devices. Several hours of high temperatures (350°–400° C) were required to anneal radiation damage in chromium gate MOS FET's, whereas the annealing of damage in aluminum devices is completed after ½ hour at 300° C.

Thermal annealing of damage in chromium doped oxides, as determined from C-V curves and from threshold voltage measurements, proceeds at different rates. This difference in annealing rates is shown by the isochronal curves of FIG. 23. The difference between threshold voltage change and C-V curve shift during annealing is an indication of the change in fast surface state density. At low temperatures, both measurements show the same rate of recovery. This fact indicates that only oxide charge is being annealed at low temperatures. A small increase in surface state density is indicated after the 100° C annealing step. This increase may be due to an intermediate state being formed in the annealing of the oxide charge. At higher temperatures, the threshold voltage shows a faster recovery than does the C-V curve. Both oxide charge and surface states are annealed at the higher temperatures. The threshold voltage, after the complete annealing procedure, was frequently less than the pre-irradiation value. The difference can be attributed to a lower surface state density. This phenomena was most apparent on devices with high initial surface state densities. An identical annealing procedure on unirradiated control devices showed no differences in the pre- and post-anneal threshold voltages.

The effect of chromium in reducing ionizing radiation damage in MOS devices is in agreement with the results reported by Lindmayer and Noble, IEEE Transactions on Electronic Devices, September 1968, p637–640. A strong dependence of threshold shift upon the oxidation process was also observed.

Although some evidence exists to help explain the radiation responses, the actual mechanisms, by which chromium causes changes in the radiation responses of the parent oxide, have not been isolated. The continued large oxide charge buildup with irradiation under positive bias demonstrates that no significant reduction in the number of hole trapping sites occurs. Existing traps, however, may be modified and new ones are probably added. The smaller threshold shifts in chromium-doped devices may well be due to enhanced electron trapping with the electrons either recombining with or compensating for trapped holes.

Two distinguishing features of radiation damage in chromium-doped oxides are the smaller, bias dependent, increase in surface state density, and the increased annealing temperature required. A higher number of surface states are created when the surface is n-type rather than p-type during irradiation. This difference in surface conductivity type appears to be responsible for the observed bias dependence of radiation-induced surface-state density.

It is apparent that the effects of ionizing radiation on a MOS structure are modified and in many respects controlled by the presence of chromium in the oxide. Results to date show that chromium doping has considerable value in the control of radiation damage in MOS structures. It appears that this technique can be employed in the fabrication of radiation-resistant p-channel MOS FET's without adversely affecting device stability and electrical characteristics.

The advantages of this process resides in the step utilizing critical temperatures in the creation of the layer of silicon dioxide over the gate region, wherein the utilization of such critical temperatures produces radiation hardened MOS devices, and in the use of the chromium layer over the layer of silicon dioxide, such process steps being described hereinbelow.

EXEMPLARY EMBODIMENT AND PROCESS STEPS

Figure 1:
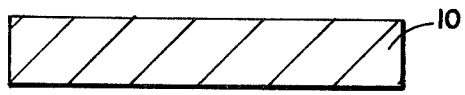
FIG. 1 is a cross-section view of a silicon wafer with one major polished surface used in this invention.

Step 1 — Referring to FIG. 1, the process is started by using a wafer of silicon 10 of approximately 7–11 × $10^{-3}$ inches thick having at least the top surface thereof polished as a substrate or base. The surfaces of wafer 10 are then cleaned using appropriate solvents or etching fluids.

Figure 2:
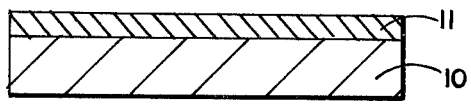
FIG. 2 shows a layer silicon dioxide formed on the polished surface of the wafer.

Step 2 — Referring to FIG. 2, the upper surface of wafer 10 is oxidized by utilization of steam at temperatures ranging between 950°–1200° centigrade thereby forming oxide surface layer 11 of silicon dioxide.

Figure 3:
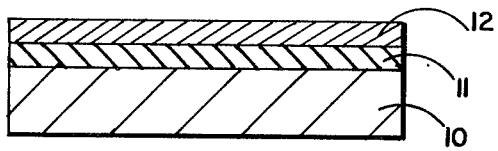
FIG. 3 shows a photoresist material after application to the surface of the silicon dioxide layer.
Figure 4:
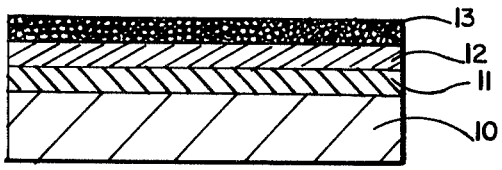
FIG. 4 shows the application of a photographic mask having the desired pattern therein laid over and in contact with the dried photoresist layer.

Step 3 — Referring to FIG. 3, photoresist material is then applied to the exposed surface of layer 11 and the wafer is spun on a turntable (not shown) so as to distribute the photoresist material forming a layer 12 on the silicon dioxide layer. Layer 12 is then baked at temperatures between 90°–120° centigrade, the temperature used being dependent upon the type of photoresist material employed.

Step 4 — Referring to FIG. 3, mask 13 having a pattern which corresponds to the source and drain regions of the MOS device is placed in contact with the dried layer 12.

Figure 5:
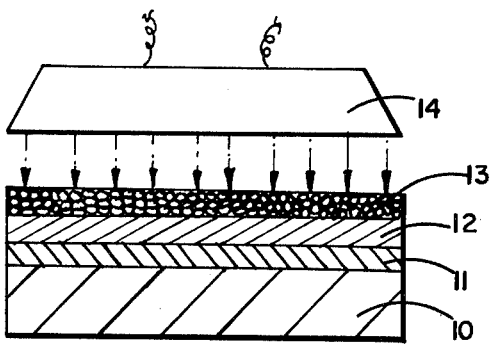
FIG. 5 shows the application of ultraviolet light through the mask for exposing desired portions of the photoresist layer.
Figure 6:
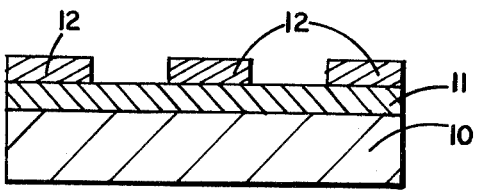
FIG. 6 shows the resultant wafer after photographic mask is removed and exhibits regions removed from the photoresist layer.

Step 5 — Referring to FIG. 5, the photoresist layer is then exposed to ultraviolet light source 14 for a time period and light intensity in accordance with the photoresist material employed for exposing at layer 12 in accordance with the pattern of mask 13. Step 6 — Referring to FIG. 6, after removal of maks 13, the exposed photoresist layer is developed in a developing solution which removes regions in the photoresist layer 12 over predetermined locations of the source and drain regions. The device is then subjected to a baking temperature between 90°–120° centigrade.

Figure 7:
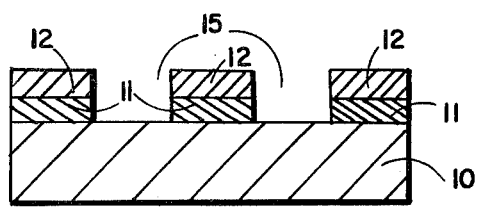
FIG. 7 shows the wafer after portions of the silicon dioxide layer have been removed.

Step 7 — Referring to FIG. 7, the device is etched in hydrofluoric acid solution which removes the exposed silicon dioxide material and forms exposed silicon areas 15 in the device.

Figure 8:
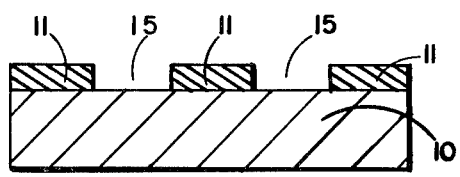
FIG. 8 shows the wafer after the remainder photoresist material has been removed.

Step 8 — Referring to FIG. 8, the remaining photoresist material 12, on the surface of the silicon dioxide insulating material, is dissolved in an appropriate solvent such as acetone, xylene, or it is chemically oxidized in hot $CrO_3+H_2SO_4$ at a temperature of approximately 100° centigrade.

Figure 9:
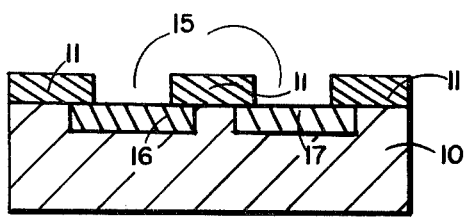
FIG. 9 shows the wafer after diffusion of boron into regions, hereafter referred to as source and drain regions.

Step 9 — Referring to FIG. 9, boron is diffused into areas 15 by a known diffusion process such as passing boron tribromide vapor in oxygen and nitrogen over the device so that boron fuses into base 10 producing source region 16 and drain region 17 therein.

Figure 10:
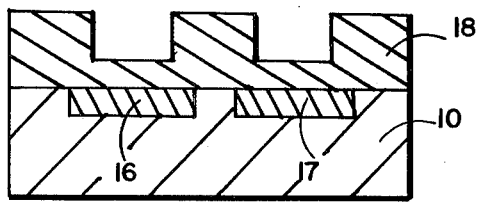
FIG. 10 shows the wafer after an additional layer of silicon dioxide has been grown over the existing layer of silicon dioxide and over the source and drain regions.

Step 10 — Referring to FIG. 10, additional silicon dioxide is grown over the surface of silicon dioxide portions, over the surface of the source and drain regions 16 and 17 and over the surface of the base material forming layer 18 thereon of silicon dioxide.

Figure 11:
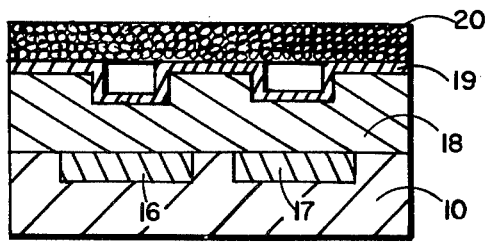
FIG. 11 shows the wafer with application of still another photoresist layer over the new silicon dioxide layer, the application of a photographic mask with predetermined source and drain contact areas and gate area therein, laid over the new photoresist layer.

Step 11 — Referring to FIG. 11, photoresist material is then applied to the exposed surface of layer 18 and the device is then spun on a turntable (not shown) so as to distribute the photoresist material to form a photoresist layer 19 on layer 18. Layer 19 is then baked at temperatures between 90°–120° centigrade, the temperature being used dependent upon the type of photoresist material employed. Mask 20 having patterns slightly smaller than the source and drain regions 16 and 17 and an additional gate region between regions 16 and 17, is applied in contact over the surface of layer 19. The device is then exposed to ultraviolet light similar to that shown in FIG. 5, mask 20 is removed, the photoresist layer 19 is developed removing regions of the photoresist material over the predetermined source, drain, and gate areas, the device is baked at a suitable temperature ranging between 90°–120° centigrade.

Figure 12:
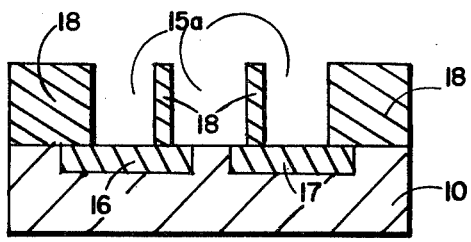
FIG. 12 shows the MOS wafer device after processing so as to carve out windows in the silicon dioxide layer over the gate and source and drain regions.

Step 12 — Referring to FIG. 12, the device is exposed to a hydrofluoric acid solution etching away exposed portions of silicon dioxide layer, and the remaining photoresist material is dissolved in a solvent such as acetone, xylene, or chemically oxidized away in hot $CrO_3+H_2SO_4$ at a temperature of approximately 100° centigrade, thereby forming areas 15a therein.

Figure 13:
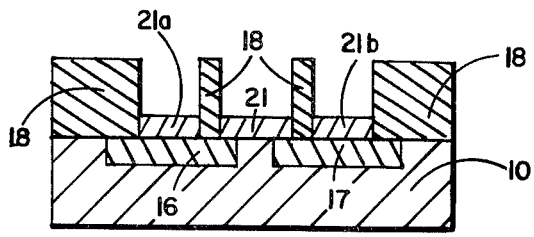
FIG. 13 shows the new growing of silicon dioxide in the windows just carved out.

Step 13 — Referring to FIG. 13, silicon dioxide layers 21, 21a and 21b are grown at temperatures ranging between 1000°–1040° centigrade. This growth process step enables the MOS device to withstand radiation from an external source radiating gamma particles or from a source proviing electromagnetic radiation and substantially hardens the device against such radiations principally due to employment of the temperatures in this growth step between 1000°–1040° centigrade that results in silicon dioxide layer over the gate region grown at said critical temperatures.

Figure 14:
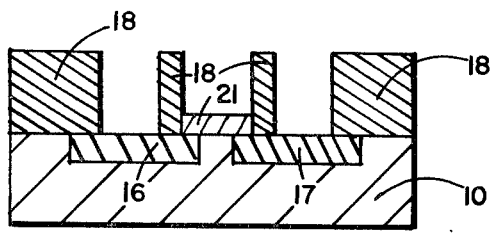
FIG. 14 shows the device after silicon dioxide over the source and drain regions have been removed.

Step 14 — Referring to FIG. 14, layers 21a and 21b are removed in a similar manner used to remove silicon dioxide as described above, by first applying a photoresist layer, baking same, applying suitable matter, exposing to ultraviolet light such surfaces over the source and drain regions developing and removing photoresist layer over the source and drain regions, baking the device, etching away areas 21a and 21b, and then dissolving the photoresist material remaining over the gate area leaving layer 21 remaining thereover.

Figure 15:
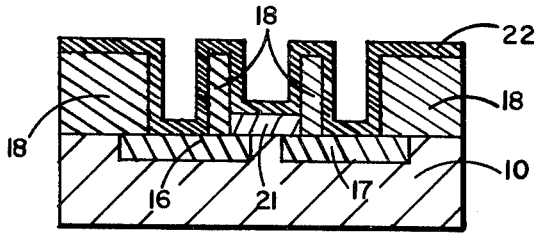
FIG. 15 shows the device after a layer of chromium has been applied over the layer upper surface of the device.

Step 15 — Referring to FIG. 15, layer 22 of chromium of approximate range thick of 200–2000 A is deposited by electron beam deposition method on the silicon dioxide 21 and on the rest of the upper surface of the device.

Figure 16:
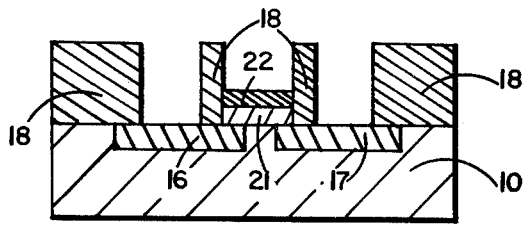
FIG. 16 shows the device after the layer of chromium has been removed from all areas except the area directly over the gate region thereby leaving a layer of chromium attached to the layer of silicon dioxide over said gate region.

Step 16 — Referring to FIG. 16, a photoresist material as used in step 3 is reapplied over the surface of layer 22, the wafer is spun for distribution of the photoresist material, and photoresist layer is baked at temperatures between 90°–120° centigrade, a mask having a pattern so that after exposure will enable chemical removal of all the photoresist material except that over gate region, is placed over the upper surface of the device and exposed to ultra-violet light similar to that shown in FIG. 5, the mask is removed, the photoresist layer is developed removing all photoresist material except that over the gate area, the chromium deposits over the source and drain areas as well as over the layer portions 18 are etched away, thereby leaving only the photoresist layer over the gate region on top of the remaining chromium portion layer, which photoresist layer remaining is removed by dissolution in an appropriate solvent such as acetone or xylene. It is noted that chromium layer 22 will thereby remain attached to silicon dioxide layer 21 over the gate region. The use of the chromium layer attributes to high degree of stability of the device in its operational mode. The wafer is also placed in a nitrogen environment furnace to anneal out the radiation damage caused by electron beam deposition of the chromium layer 22 and at the same time diffusing a portion of chromium 22 layer remaining into the silicon dioxide.

Figure 17:
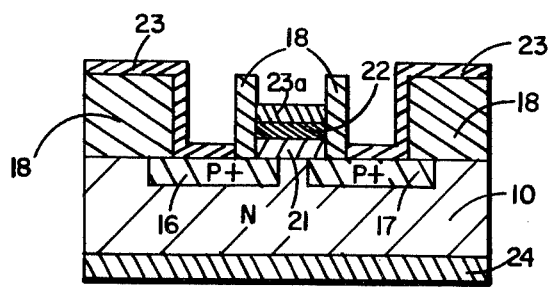
FIG. 17 shows the device with a metallic aluminum layer on the upper surface of the device for making contact with the source, drain, and gate regions, and a layer on the lower surface of gold for making metallic contact to the base or substrate of the device.
Figure 18:
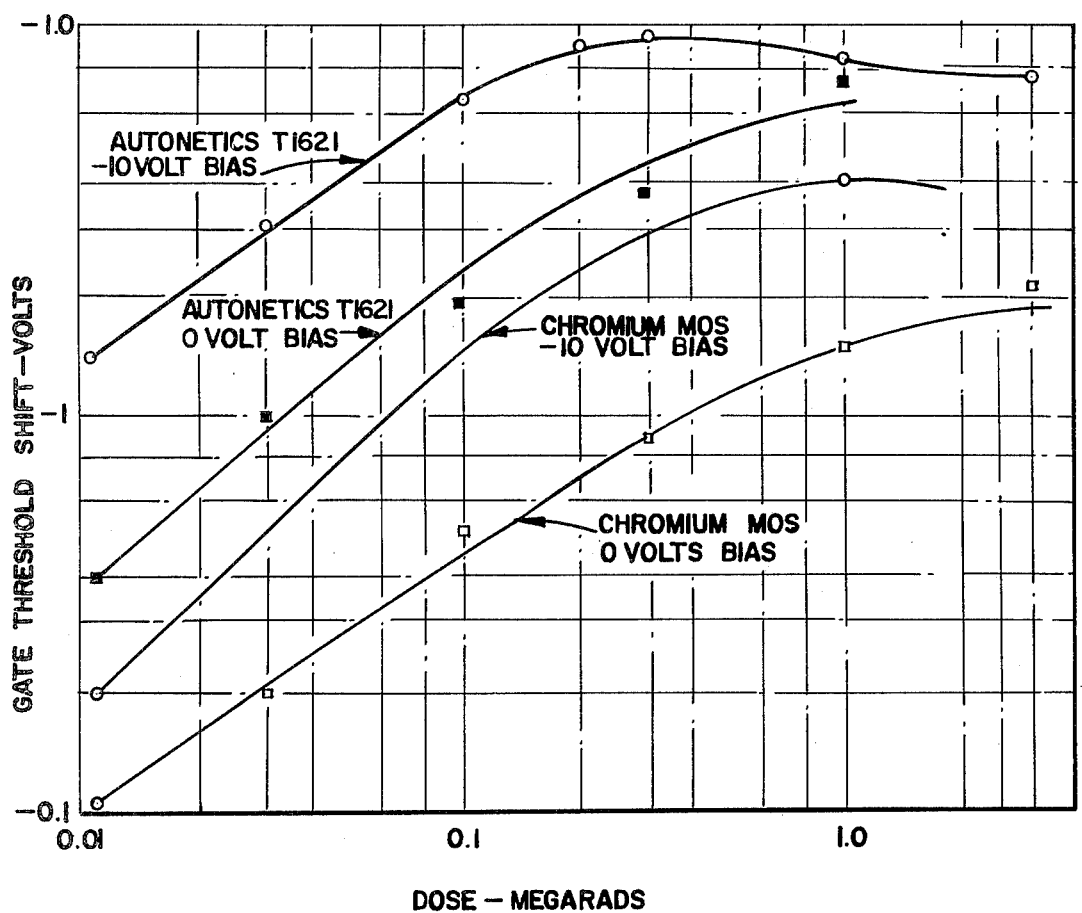
FIG. 18 shows ionizing radiation damage in chromium gate type and conventional MOS transistors.
Figure 19:
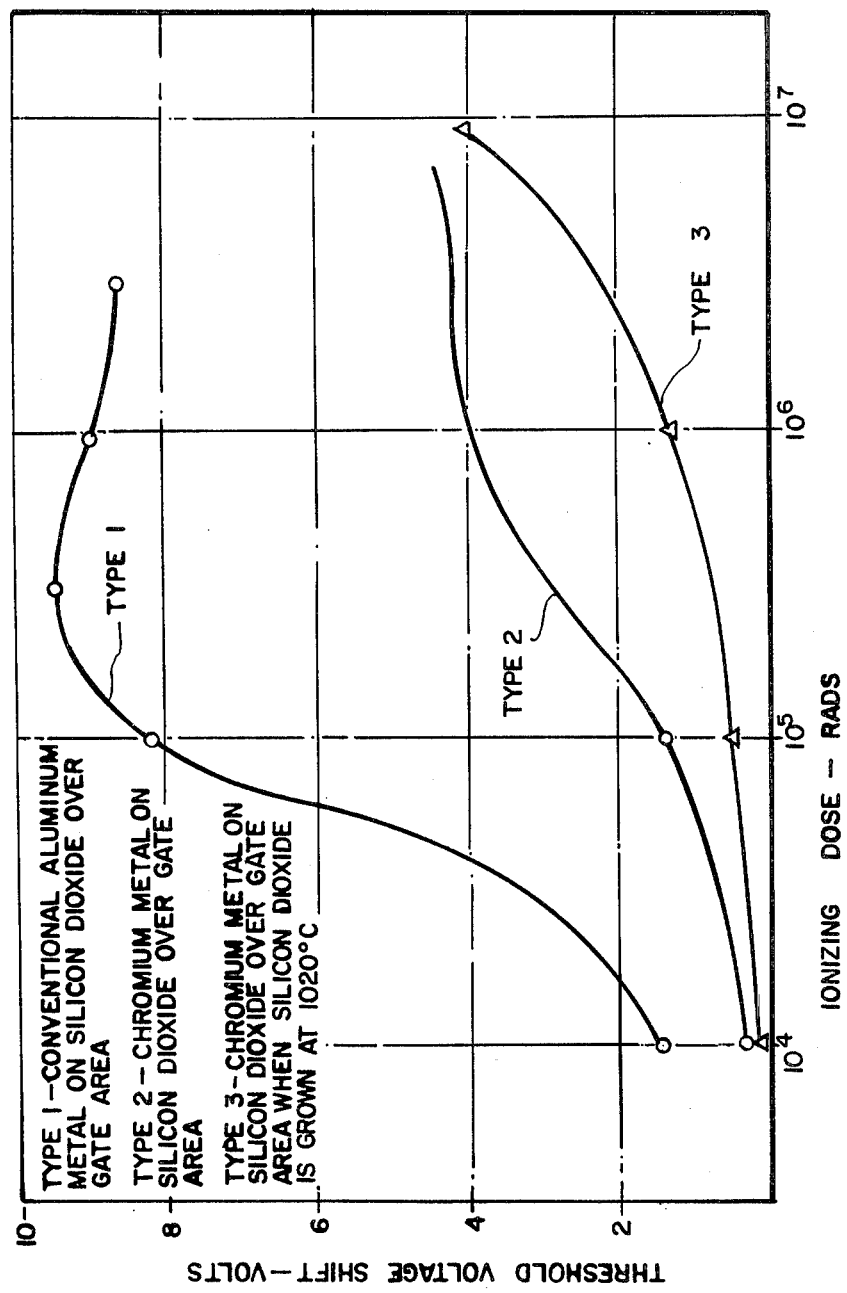
FIG. 19 shows ionization effects under irradiation utilizing three different types of MOS devices.
Figure 20:
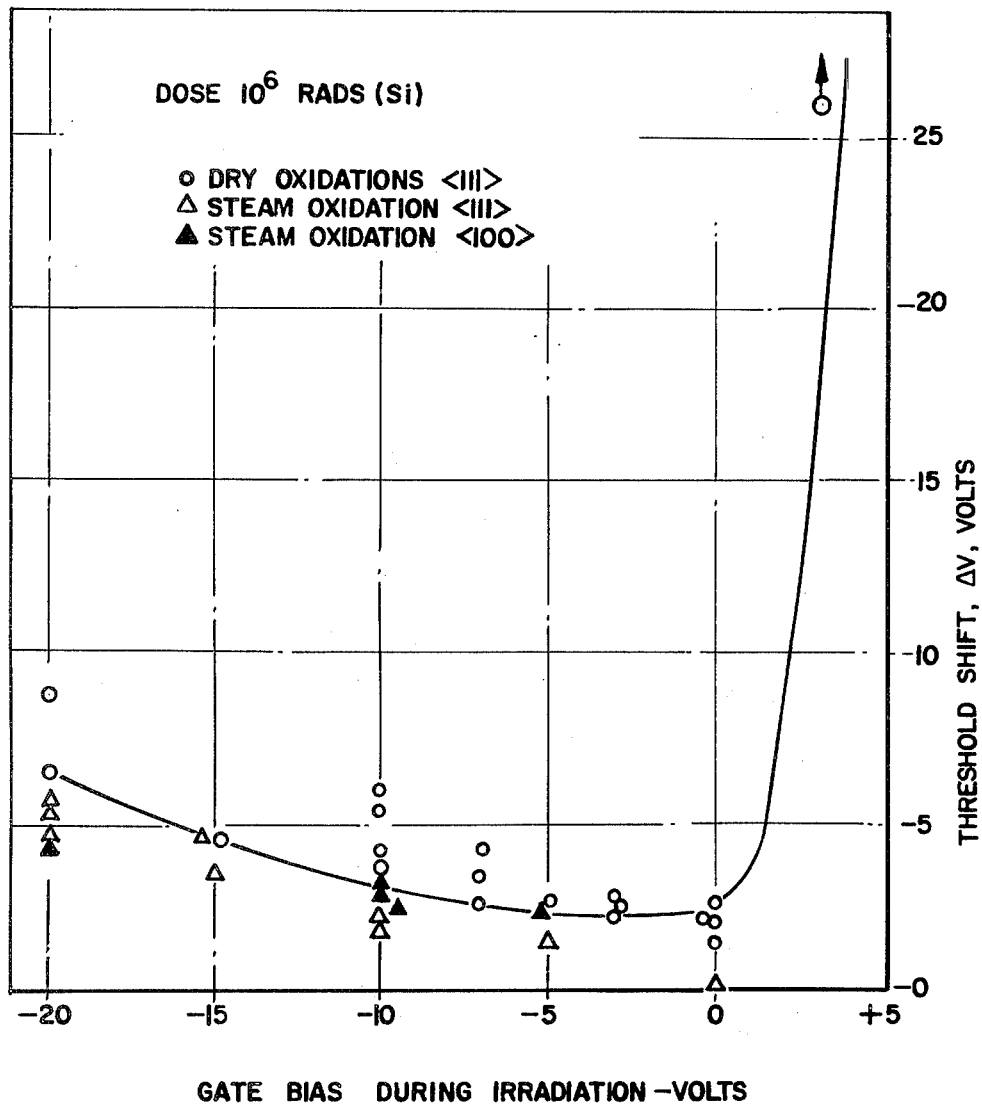
FIG. 20 shows bias dependence of radiation induced threshold shift in chromium gate MOS devices. The data scatter represents different runs.
Figure 21:
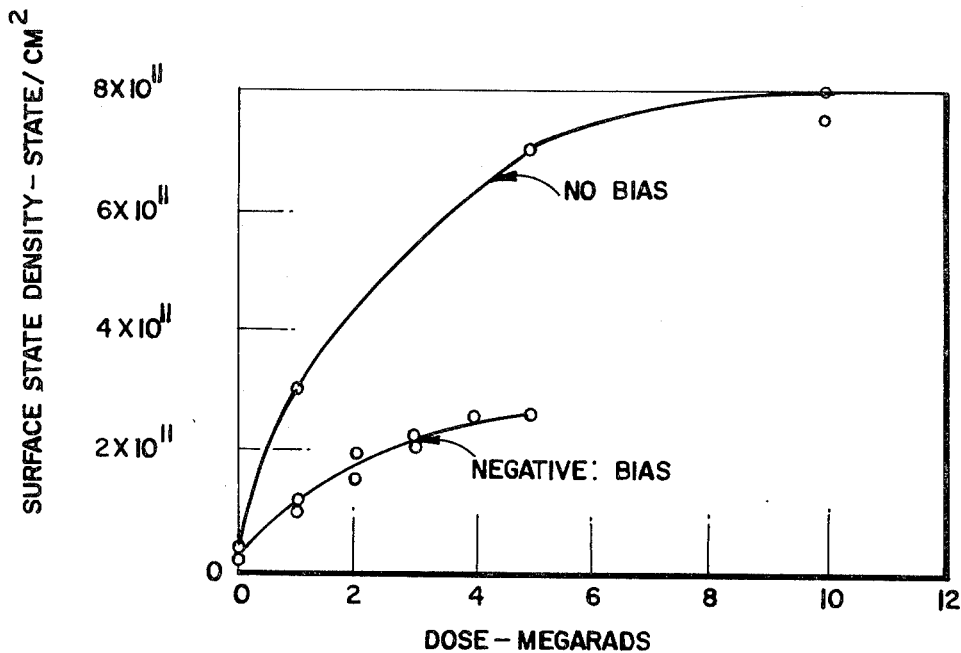
FIG. 21 shows increase of surface state density with ionizing does.
Figure 22:
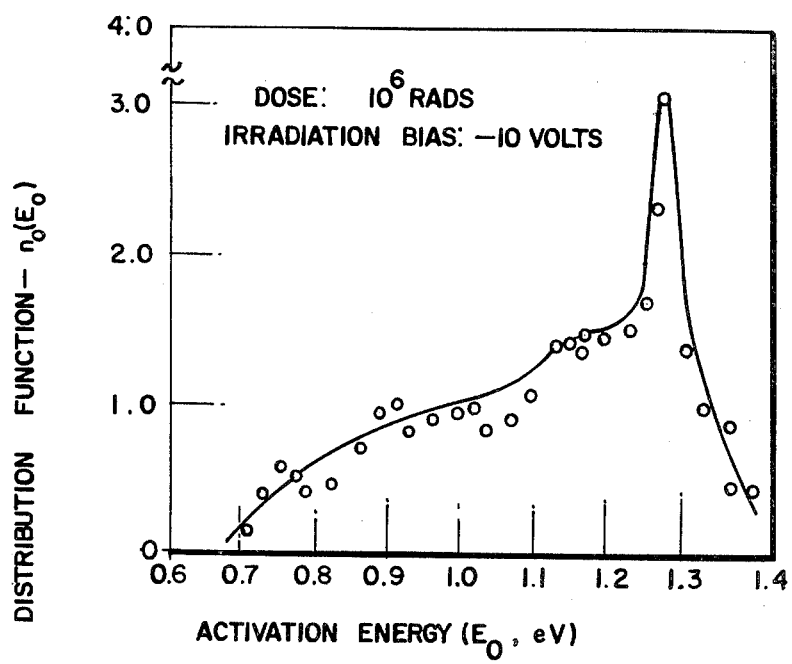
FIG. 22 shows activation energy spectrum for thermal annealing of ionization damage in MOS FET's.
Figure 23:
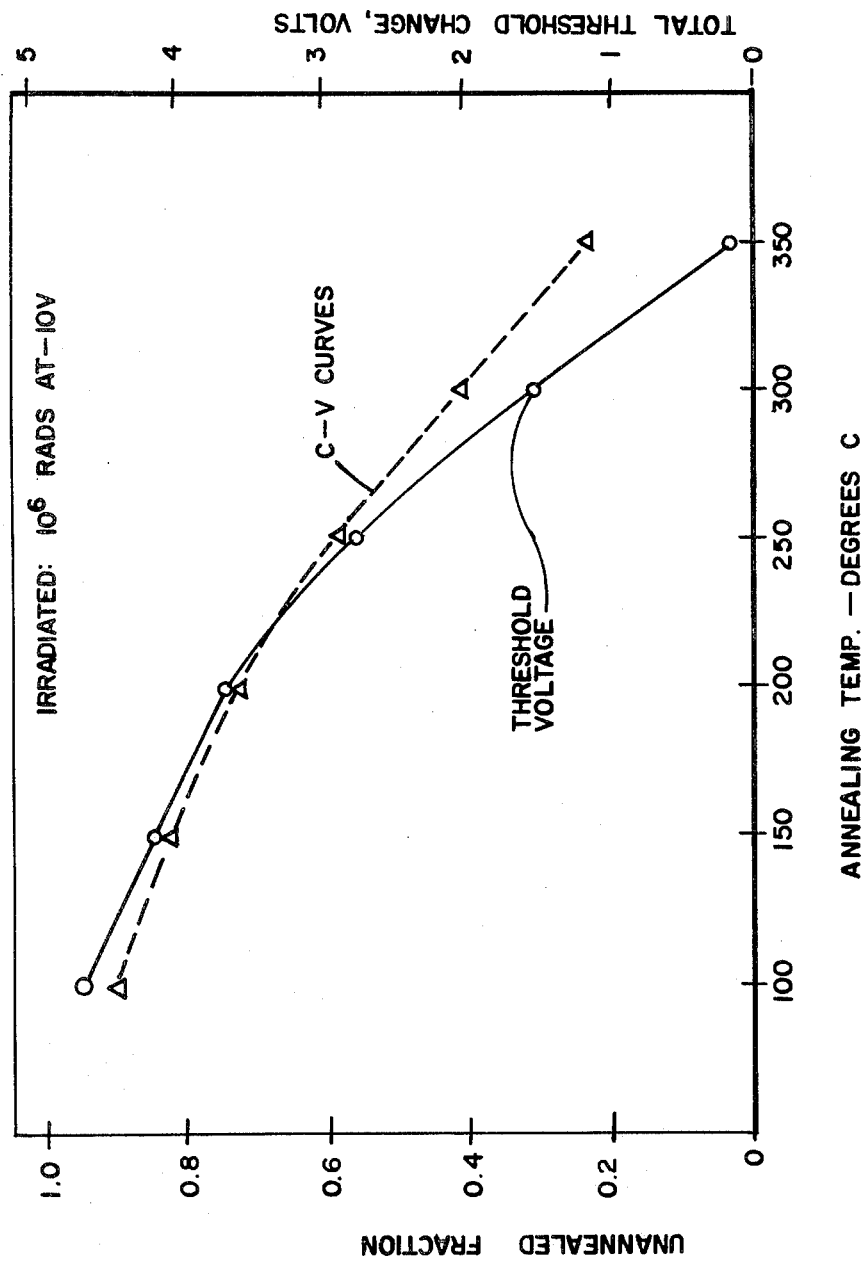
FIG. 23 shows recovery of threshold voltage and intrinsic voltage during thermal annealing of ionization damage in a MOS FET.

Step 17 — Referring to FIG. 17, using known methods, layer portions 23 and 23a of aluminum are layed down to provide metallic electrical contacts for the source and drain, and gate regions respectively, and layer 24 is applied, generally of gold, to provide metallic electric contact to the base or substrate of the device. Silicon wafer 10 being the base is shown as N-type material and source region 16 and drain region 17 are shown herein as being of P+ material.

Note: — It should be noted that layer 22 is not restricted exclusively to chromium, in the above steps. A metallic layer which may consist of titanium or vanadium and other metals are usable in lieu of chromium for forming layer 22.

We claim:
1. In a process for making a semiconductor device which is hardened to radiation for external means, the steps of:
   growing an insulating layer at least on the gate region of said device at temperatures ranging between 1000° and 1040° centigrade; and
   depositing a metallic layer on at least the insulating layer which is over the gate region of said device.
2. The process as set forth in claim 1, including the further step of:
   diffusing that portion of said metallic layer which is attached to the insulating layer at said gate region after the step of depositing.
3. The process as set forth in claim 1, wherein:
   the insulating layer on the gate region is silicon dioxide.
4. The process as set forth in claim 1, wherein:
   the metallic layer is chromium.
5. In a process for making a semiconductor device which withstands radiation from external means, the steps of:
   growing an insulating layer at least on the gate region of said device at temperatures ranging between 1000° and 1040° centigrade; and
   depositing a metallic layer on at least the insulating layer which is over the gate region of said device.
6. The process as set forth in claim 5, including the step of:
   diffusing that portion of said metallic layer which is attached to the insulating layer at said gate region after the step of depositing.
7. The process as set forth in claim 5, wherein:
   the metallic layer is chromium.
8. A device made by the process as stated in claim 5, comprising:
   a semiconductor wafer having a first type of conductivity;
   a plurality of regions having a second type of conductivity which is opposite to the first type of conductivity; and
   an insulating layer covering at least portions of said regions and covering the gate region of said wafer.
9. A device made by the process as stated in claim 6, comprising:
   a semiconductor wafer having a first type of conductivity;
   a plurality of regions having a second type of conductivity which is opposite to the first type of conductivity;
   an insulating layer covering at least portions of said regions and covering the gate region of said wafer; and
   a layer of chromium attached to and diffused in-part with the surface of the insulating layer which covers the gate region.
10. The device made by the process as stated in claim 8, wherein:
    the insulating layer on the gate region is silicon dioxide.
11. The device made by the process as stated in claim 9, wherein:
    the insulating layer on the gate region is silicon dioxide.

* * * * *